(12) United States Patent
Koch

(10) Patent No.: US 6,175,509 B1
(45) Date of Patent: *Jan. 16, 2001

(54) SPACE EFFICIENT LOCAL REGULATOR FOR A MICROPROCESSOR

(75) Inventor: James K. Koch, Rocklin, CA (US)

(73) Assignee: Hewlett-Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 08/856,312

(22) Filed: May 14, 1997

(51) Int. Cl.[7] .............................. H05K 7/02; H05K 1/16; H01R 4/60
(52) U.S. Cl. .................. 361/809; 174/260; 174/71 B; 174/72 B; 361/807; 361/810; 361/775; 439/212
(58) Field of Search .................. 174/260, 71 B, 174/72 B, 88 B, 99 B, 70 B; 361/748, 760, 761, 762, 807, 809, 811, 753, 772, 773, 774, 783, 789, 803, 826, 775; 439/212

(56) References Cited

U.S. PATENT DOCUMENTS

| 4,008,365 | | 2/1977 | Carlson | 174/68.2 |
|---|---|---|---|---|
| 4,758,927 | * | 7/1988 | Berg | 361/761 |
| 4,867,696 | | 9/1989 | Demler, Jr. et al. | 439/212 |
| 4,981,449 | | 1/1991 | Butchter | 439/724 |
| 5,184,284 | * | 2/1993 | Ashelin et al. | 174/260 X |
| 5,290,971 | * | 3/1994 | Hamaguchi et al. | 174/260 X |
| 5,313,367 | * | 5/1994 | Ishiyama | 361/772 |
| 5,317,479 | * | 5/1994 | Pai et al. | 174/260 X |
| 5,430,614 | * | 7/1995 | Difrancesco | 174/260 X |
| 6,024,589 | * | 2/2000 | Hahn, IV et al. | 439/212 |

* cited by examiner

*Primary Examiner*—Hyung-Sub Sough
(74) *Attorney, Agent, or Firm*—Denise A. Lee

(57) ABSTRACT

The present invention is a mounting platform for placement of a first device on a first plane in close proximity to a second device on a second plane. In the preferred embodiment, the first device is a voltage regulator circuit, the second device is a microprocessor, the first plane is the surface of the platform printed circuit board (PCB), and the second plane is the surface of the base printed circuit board. Typically the microprocessor is electrically coupled to the base printed circuit board and the voltage regulator circuit is electrically coupled to the platform printed circuit board. The mounting platform is mounted as a mezzanine over the base printed circuit board on the platform printed circuit board. Mounting the voltage regulator in this way allows the voltage regulator output to be placed adjacent to the microprocessor chip while at the same time minimizing the amount of valuable board space that is used.

15 Claims, 5 Drawing Sheets

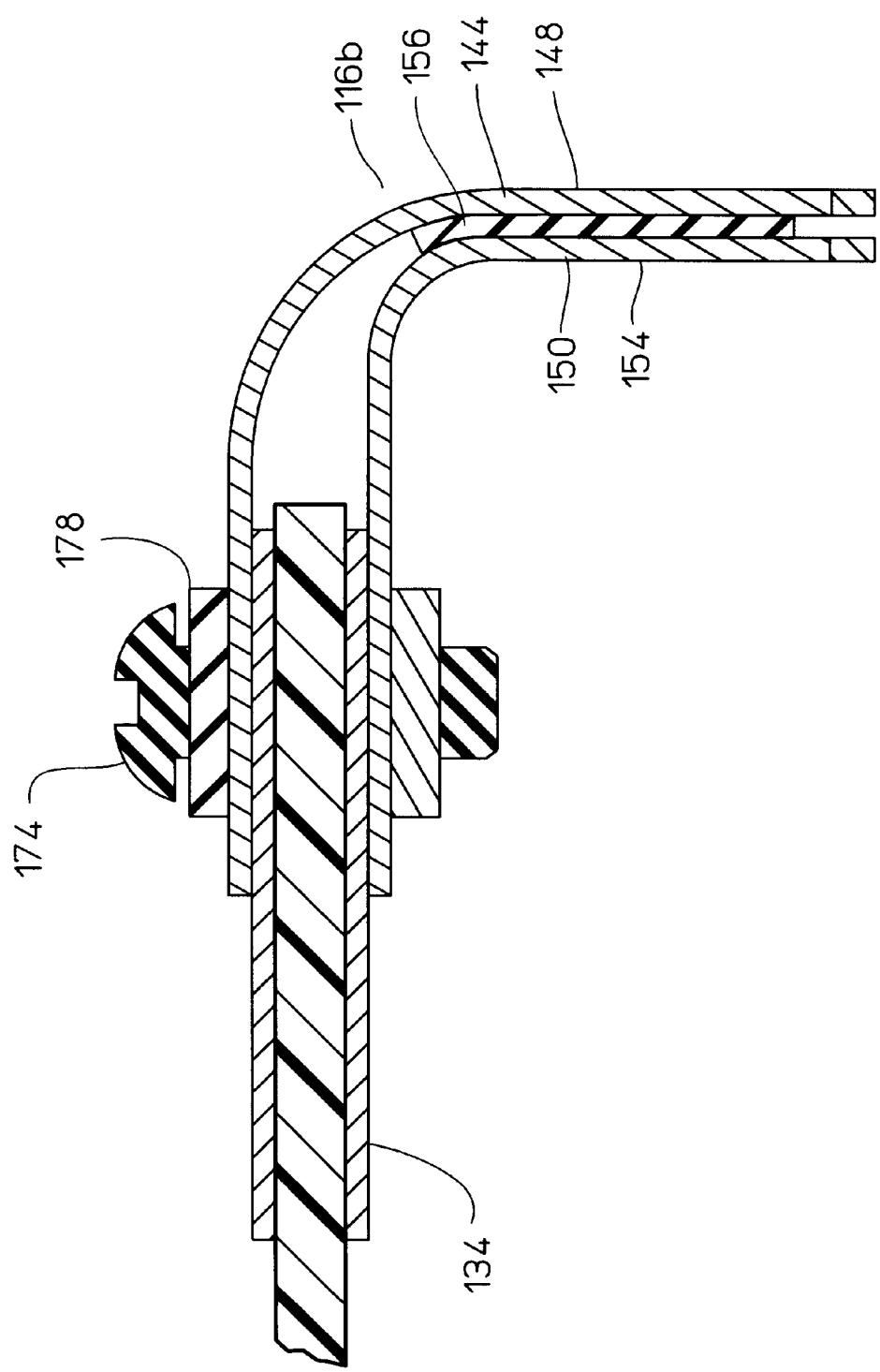

SPACE EFFICIENT LOCAL REGULATOR FOR A MICROPROCESSOR

REFERENCE TO RELATED APPLICATION

Reference is made to the following co-pending and commonly assigned U.S. patent application entitled: POWER BUS BAR FOR PROVIDING A LOW IMPEDANCE CONNECTION BETWEEN A FIRST AND SECOND PRINTED CIRCUIT BOARD, Ser. No. 08/856,500, now U.S. Pat. No. 6,024,589 May 14, 1997.

BACKGROUND OF THE INVENTION

Modern microprocessors require the output of high current at relatively low voltage levels, typically in the range of zero to five volts. Further, although microprocessor requires high current, the current demands for requirements fluctuate widely. For example, in the sleep or idle mode a microprocessor might require currents in the range of 0.5 A to 5 A while a microprocessor in a faster computing mode might require currents in the range of 10 A to 100 A. However even though current requirements fluctuate widely, microprocessor specifications require that the voltage limits remain relatively stable, no matter what the operational mode of the microprocessor.

Requirements for tight voltage regulation in response to highly variable current demands mean that the main power supply output can no longer be fed directly to the microprocessor. Instead, a voltage regulator is used to deliver a tightly controlled voltage to the microprocessor. A local voltage regulator supplies a high level of DC current and minimizes the uncertainty in voltage drops between the main power supply and the microprocessor.

Although a voltage regulator circuit provides tight voltage regulation, it must be placed in close proximity to the microprocessor. If the voltage regulator is too far from the microprocessor, impedance between the voltage regulator and microprocessor increases, causing poor voltage regulation at the microprocessor. Further, an increase in impedance decreases speed and increases voltage drops. As the clock speed requirements for microprocessors increase, increases in impedance become less and less acceptable.

A problem with positioning the voltage regulator circuit in close proximity to the microprocessor is that other peripheral devices that work with the microprocessor may be displaced. For example, memory chips, etc. also need to be in close proximity to microprocessor. Thus, the voltage regulator circuit uses up a significant amount of board space which could otherwise be used effectively for the placement of cache memory or other integrated circuits peripheral to the microprocessor, which also need to be close to the microprocessor for reasons of signal integrity. Further, because space constraints are so tight, it is difficult to customize a board for the customer by adding different optional components since board space near the microprocessor is so limited.

A method and apparatus for locating a voltage regulator circuit close to microprocessor while minimizing the required board space and minimizing impedance is needed.

SUMMARY OF THE INVENTION

The present invention is a mounting platform for placement of a first device on a first plane in close proximity to a second device on a second plane. In the preferred embodiment, the first device is a voltage regulator circuit, the second device is a microprocessor, the first plane is the surface of the platform printed circuit board (PCB), and the second plane is the surface of the base printed circuit board. Typically the microprocessor is electrically coupled to the base printed circuit board and the voltage regulator circuit is electrically coupled to the platform printed circuit board. The mounting platform is mounted as a mezzanine over the base printed circuit board on the platform printed circuit board. Mounting the voltage regulator allows the voltage regulator output to be placed adjacent to the microprocessor chip while at the same time minimizing the amount of valuable board space that is used.

The mounting platform forms a "table" over the second plane and is typically comprised of a platform top and a plurality of elongate legs that are soldered or otherwise connected to the platform top. Typically, the platform top of the mounting platform includes of a platform printed circuit board having a power plane and a ground plane. Similarly, the base printed circuit board also includes a power plane and a ground plane. The plurality of elongate legs electrically connect the power plane of the platform PCB to the power plane of the base PCB and electrically connect the ground plane of the platform PCB to the ground plane of the base PCB.

The plurality of elongate legs that are connected to the platform top typically includes an output power leg, an input power leg, and at least a first support leg. Both the input power leg and the output power leg are comprised of a first conductor, a second conductor and an insulator positioned between the first and second conductors. The first and second conductors of the input and output power legs form a low impedance transmission line. The high dielectric constant of the insulator positioned between the first and second conductors provides distributed capacitance between the first and second conductors, lowering the AC impedance and improving the transient response.

Preferably, the first input conductor and the first output conductor are electrically coupled to the power plane of the platform printed circuit board. Similarly, the second input conductor and the second output conductor are electrically coupled to the ground plane of the platform printed circuit board. The input power leg of the mounting platform carries power to the voltage regulator. The output power leg of the mounting platform carries the output power of the voltage regulator to the microprocessor.

In the preferred embodiment, the platform top is comprised of a platform printed circuit board and a platform conductive frame. In the preferred embodiment, the second input conductor and the second output conductors extend from a unitary platform conductive frame that is electrically connected to the ground plane of the platform printed circuit board. The second output conductor and the second input conductors extend from and form part of the unitary platform conductive frame structure. Typically, the platform conductive frame is positioned underneath the platform printed circuit board. Preferably, the platform conductive frame is used as a ground plane for the voltage regulator circuit and for conducting ground current to the microprocessor through one or more of the "legs" of the mounting platform. Because the platform conductive frame acts as ground, the ground plane of the platform printed circuit board is no longer required.

The mounting platform offers a practical and cost-efficient way to locate a very high current voltage regulator in close proximity to the microprocessor chip without significantly reducing the amount of board space available for logic circuits peripheral to the microprocessor. The mounting platform is mechanically stable and is resistant to high levels of shock and vibration. Further, the conductive portions of the legs and the platform conductive frame of the mounting platform act as heat sinks, providing increased cooling for the system. In addition, the platform conductive frame and the platform legs of the mounting platform provide shielding to isolate the voltage regulator circuit from the microprocessor circuit.

A further understanding of the nature and advantages of the invention described herein may be realized by reference to the remaining portions of the specification and the drawings.

BRIEF DESCRIPTION OF THE DRAWINGS

FIG. 5 shows a side cross-sectional view of the output leg of the mounting platform shown in FIG. 4.

DETAILED DESCRIPTION OF THE PREFERRED EMBODIMENTS

Figure 1:
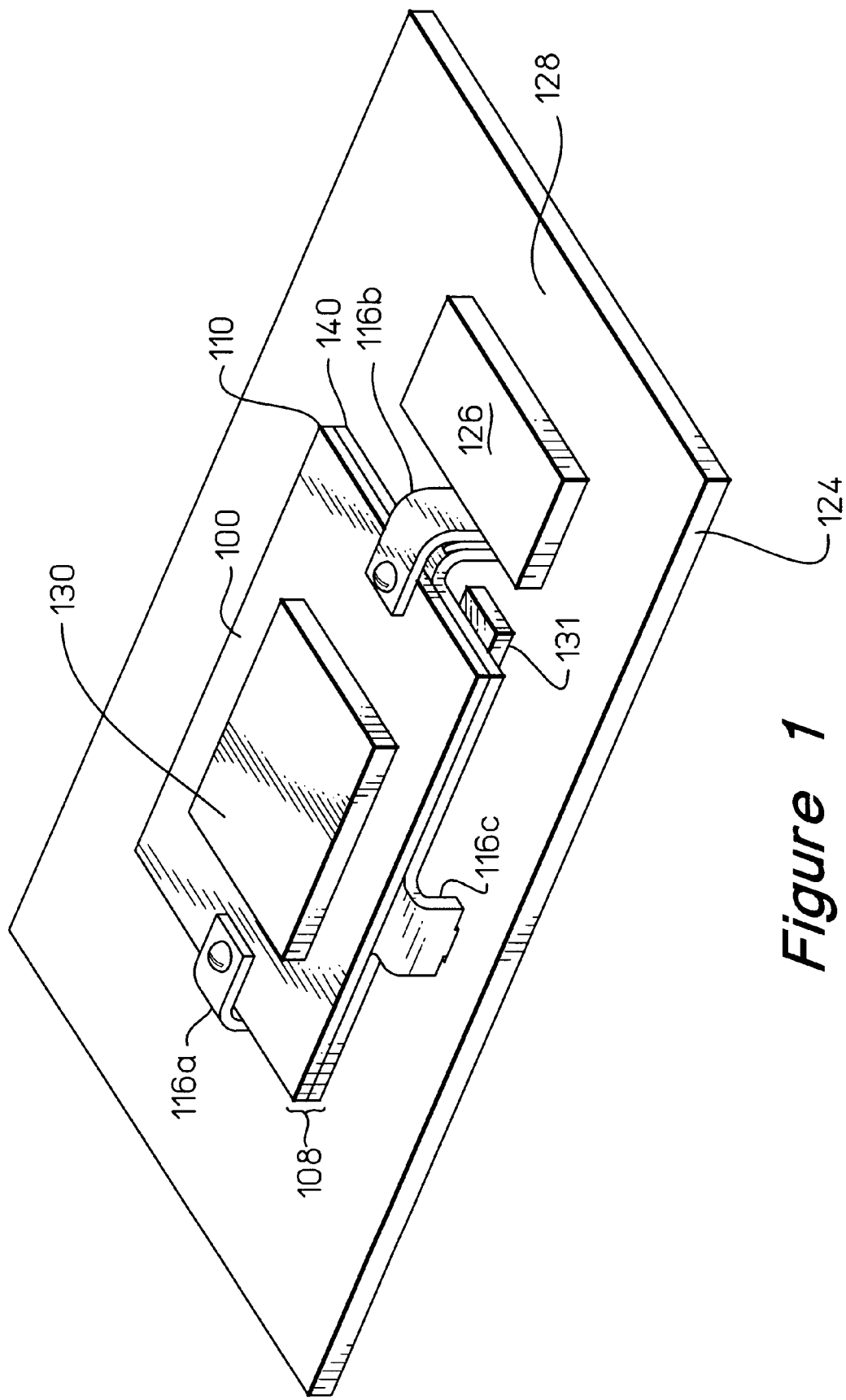
FIG. 1 shows the mounting platform according to the preferred embodiment of the present invention.

FIG. 1 shows a mounting platform 100 according to a first embodiment of the invention. The mounting platform 100 is comprised of a platform top 108 including a platform printed circuit board 110 that includes a first electrical contact 132 and a second electrical contact 134 and a plurality of elongate legs including an input leg 116a, an output power leg 116b, and at least a first support leg 16c. The platform printed circuit board 110 has a first surface 118 and a second surface 120. Typically, the first electrical contact 132 is formed on the first surface 118 of the platform printed circuit board 110 and the second electrical contact 134 is formed on the second surface 120 of the platform printed circuit board 110.

In the preferred embodiment the mounting platform 100 is mechanically and electrically coupled to a base printed circuit board 124. The mounting platform 100 is configured so that a second device 126 on the first surface 128 of the base PCB 124 is in close proximity to a first device 130 on the first surface of the 118 of the platform PCB 110. In the preferred embodiment, the first device 130 is a voltage regulator circuit, the second device 126 is a microprocessor, the first plane is the first surface 118 of the platform printed circuit board (PCB), and the second plane is the first surface 128 of the base printed circuit board. The voltage regulator 130 is mounted on a first surface 118 of the platform printed circuit board 110 and is electrically coupled to the platform printed circuit board 110 while the microprocessor 126 is mounted to and electrically coupled to the first surface 128 of the base printed circuit board 124.

Mounting the voltage regulator circuit 130 over the base printed circuit board 124 allows both the voltage regulator 130 and other peripheral logic chips 131 to be positioned close to the microprocessor 126. The mounting platform can be placed close to the load without using a significant amount of board space near the load. This is advantageous in circuits such as microprocessors which are high speed and which use relatively large currents at a low voltage.

Theoretically, the entire mounting platform or a portion of the mounting platform could be physically located over the microprocessor. However, for reasons including efficient heat dissipation, etc. the mounting platform is not placed directly over the microprocessor. Instead, the mounting platform 100 is typically placed adjacent to the microprocessor 126. The output power leg 116b of the mounting platform, the leg carrying power from the voltage regulator to the microprocessor, should be placed as close to the microprocessor 126 as possible.

Figure 2:
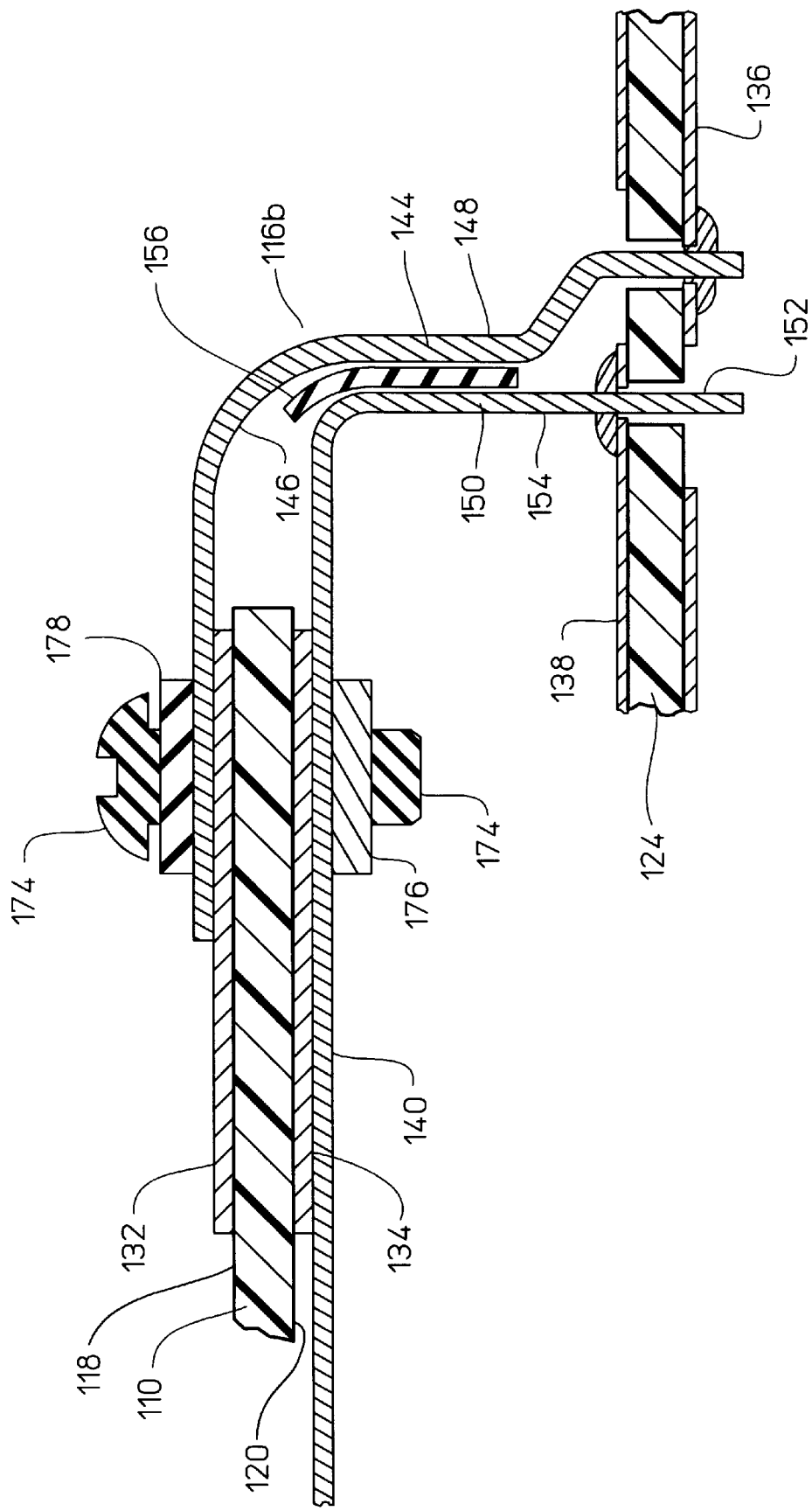
FIG. 2 shows a side cross-sectional view of the output leg of the mounting platform shown in FIG. 1.

FIG. 2 shows a side cross-sectional view of the output leg 116b of the mounting platform shown in FIG. 1. Referring to FIG. 2 shows that the platform printed circuit board 110 includes a first electrical contact 132 and a second electrical contact 134. The first electrical contact 132 is formed on the first surface of the platform PCB 110 and is typically connected to the platform power plane. Power plane means an electrical network which connects a common voltage to a number of circuit nodes. The platform PCB and the base PCB may have a plurality of power planes and may have a corresponding electrical contact for each of the power plane.

The second electrical contact 134 is formed on the second surface of the platform PCB 110 and is typically connected to the platform ground plane. Similarly, the base PCB typically includes a first electrical contact 136 and a second electrical contact 138. The first electrical contact 136 is formed on the second surface of the base PCB 124 and is typically connected to the base power plane while the second electrical contact 138 is formed on the first surface 128 of the base PCB and is typically electrically connected to base ground plane.

The mounting platform 100 includes a plurality of elongate legs 116a–116c, including at least an output power leg 116b. Preferably, the mounting platform 100 further includes an input power leg 116a and a support leg 116c. The output power leg 116b includes a first output conductor having a first surface 146 and a second surface 148, a second output conductor 150 having a first surface 152 and a second surface 154, and an output power insulator 156 positioned between the first surface 146 of the first output conductor 144 and the first surface 152 of the second output conductor 150. Similarly, the input power leg 116a includes a first input conductor 160 having a first surface 162 and a second surface 164, a second input conductor 166 having a first surface 168 and a second surface 170, and an input power insulator (not shown) positioned between the first surface 162 of the first input conductor 160 and the first surface 168 of the second input conductor 166. Typically the input and output conductors are made of solid, copper with plating suitable for electrical contact.

The first and second output conductors 144, 150 and the first and second input conductors 160, 166 form low impedance transmission lines at high frequencies. Thus, preferably the output power insulator 156 and the input power insulator not shown have a high dielectric constant. The configuration of two power conductors separated by an insulator, provides distributed capacitance between the power conductors, lowering the AC impedance of the system. In an alternative embodiment, no insulator other than air is positioned between the power conductor surfaces, however, this decreases system performance. Further, in this alternative configuration it is critical that the conductor surfaces do not touch to create a short.

In the preferred embodiment, the mounting platform 100 includes a support leg 116c. In the embodiment shown in FIGS. 1 and 3, the support legs 116c are conductive structure that extends from the platform conductive frame 140. In the configuration shown in FIGS. 1 and 3, the support leg 116c is preferably coupled to ground. In the configuration shown in FIG. 4, the support leg 116c is a stand-off that provides mechanical support but is not necessarily electrically coupled to ground.

In the embodiment shown in FIG. 2, the input power leg 116a, the output power leg 116b, and the support leg 116c are electrically and mechanically coupled to the platform-printed circuit board 110. Various connection means may be used for connecting the input power leg 116a, output power leg 116b and support leg 116c including soldering the legs 116a–116c to the platform printed circuit board 110 or alternatively by using the bus bar described in the patent application entitled "A Power Bus Bar for Providing a Low Impedance Connection between a First and Second Printed Circuit Board" filed May 14, 1997 which is hereby incorporated by reference. However, in the preferred embodiment a second end of the output power leg 116b and a second end of the input power leg 116a are mechanically and electrically coupled to the platform PCB using a fastening means 174 and the first end of the output power leg 116b and the first end of the input power leg 116a are mechanically and electrically coupled to the base PCB 124 by soldering the first end of the output power leg 116b and the input power leg 116a to the base PCB 124.

Preferably the first end of the mounting platform legs 116a–c is narrowed to form one or more tabs for easy insertion into the base printed circuit board 124. The tab at the end of the platform legs is positioned adjacent to and in close proximity to the load (the microprocessor). Referring to FIG. 2, the tab at the end of the platform legs is typically soldered to the base printed circuit board which provides a good electrical and mechanical connection. The soldering can be of the "through-hole" type (illustrated) or the "surfacemount" type.

In the embodiment shown in FIG. 2, the first end of the first output conductor 144 and the first end of the second output conductor 150 are soldered to the base PCB 124. The first end of the first output conductor 144 is soldered to the first base electrical contact 136. The first end of the second output conductor 150 is soldered to the second base electrical contact (the ground plane). Similarly, the first end of the first input conductor and the first end of the second input conductor are soldered to the base PCB 124.

Because the first output conductor 144 is electrically coupled to a different electrical contact than the first input conductors 160, the voltage to which the first output conductor is preferably coupled is different than the voltage that the first input conductor is coupled to. For example, the first input conductor could be electrically coupled to a 5 volt input voltage while the first output conductor (the power going to the microprocessor) could be coupled to a 3.3 volt output voltage.

Referring to FIG. 2, the second end of the output conductor 144 is electrically coupled to the platform PCB 110 using a fastening means 174 which applies pressure to push the two output conductors together to make a good electrical contact to both surfaces of the platform PCB. The fastening means 174, typically includes a screw which is inserted through openings in the platform PCB, the first and second output conductors and a threaded fastener 176, 144, 150.

Typically, both the platform printed circuit board 110 and the base printed circuit board 124 have a power plane and a ground plane. Preferably, the first electrical contact 132 of the platform printed circuit board is connected to the power plane of the platform printed circuit board and the first electrical contact 136 of the base printed circuit board is electrically coupled to the power plane. Similarly, in the preferred embodiment the second electrical contact 134 of the platform printed circuit board is connected to the ground plane of the platform printed circuit board and the second electrical contact 138 of the base printed circuit board is electrically coupled to the ground plane of the base printed circuit board.

The first output conductor is electrically coupled to the first electrical contact of the platform PCB and the first electrical contact of the base PCB. Similarly, the second output conductor is electrically coupled to the second electrical contact of the platform PCB and the second electrical contact of the base PCB. Thus, the output power leg electrically connects the output voltage of the voltage regulator to the power plane of the base PCB and electrically connects the ground plane of the platform PCB to the ground plane of the base PCB. The first output conductor typically carries the output power of the voltage regulator to the microprocessor. The second output conductor connects the ground plane of the platform PCB to the ground plane of the base PCB.

Typically, the platform printed circuit board 110 has a third electrical contact formed on the first surface of the platform PCB 110 and a fourth electrical contact formed on the second surface of the platform PCB. Similarly, the base printed circuit board 124 has third electrical contact formed on the second surface of the base PCB 110 and a fourth electrical contact formed on the first surface of the base PCB. Preferably, the third electrical contact of the platform PCB is electrically coupled to the third electrical contact of the base printed circuit board by the first input conductor. Similarly, in the preferred embodiment the fourth electrical contact of the platform PCB is connected to the fourth electrical contact of the base PCB by the second input conductor.

The first input conductor is electrically coupled to the third electrical contact of the platform PCB and the third electrical contact of the base PCB. Similarly, the second input conductor is electrically coupled to the fourth electrical contact of the platform PCB and the fourth electrical contact of the base PCB. Thus, the input power leg electrically connects the input power plane of the platform PCB to the appropriate power plane of the base PCB and electrically connects the input ground plane of the platform PCB to the ground plane of the base PCB. The first input conductor typically carries the input power to the voltage regulator. The second input conductor connects the ground plane of the platform PCB to the ground plane of the base PCB.

The elongate legs 116a–c are positioned so that first surface of base printed circuit board is generally parallel to the first surface of the platform printed circuit board. In an alternative embodiment, the mounting platform includes only an output power leg 116b and not an input power leg. In this case, the input power must be electrically coupled to the device on the mounting platform in an alternative fashion. For example, the input power might be connected to the platform PCB using a cable that is electrically coupled to the base PCB.

Figure 3:
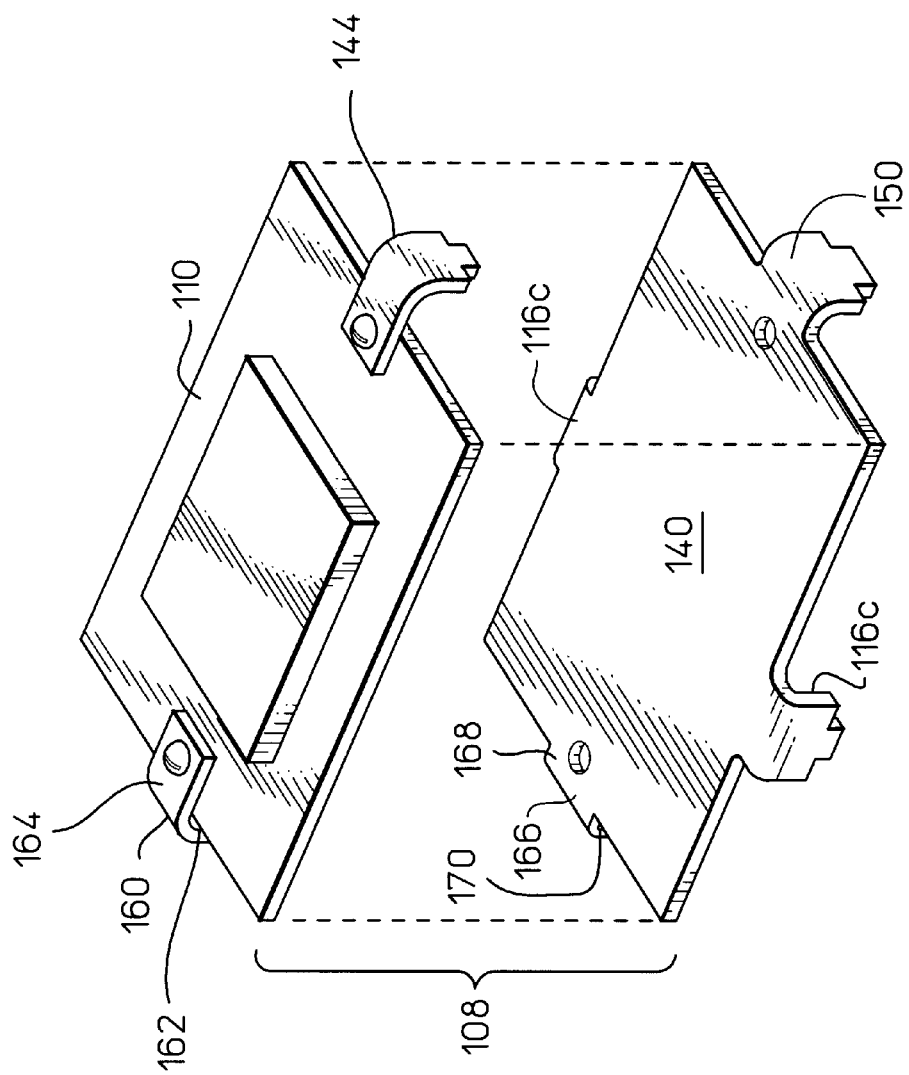
FIG. 3 shows a partial exploded view of the mounting platform shown in FIG. 1.

FIG. 3 shows a partial exploded view of the mounting platform shown in FIG. 1. In the embodiment shown in FIG. 3, the platform top 108 is comprised of a platform printed circuit board 110 and a platform conductive frame 140. In the embodiment shown in FIG. 3, the second input conductor and the second output conductor extend from the platform conductive frame. Typically, the platform conductive frame is positioned underneath the second surface of the platform printed circuit board. Typically the platform conductive frame is electrically coupled to the ground and is used as the ground plane for the voltage regulator circuit and for conducting ground current through the second output conductor and the second input conductors to the base PCB. Although preferably the platform conductive frame is a unitary structure, it may include openings to prevent shorting of conductive components on the second surface of the platform PCB.

Figure 4:
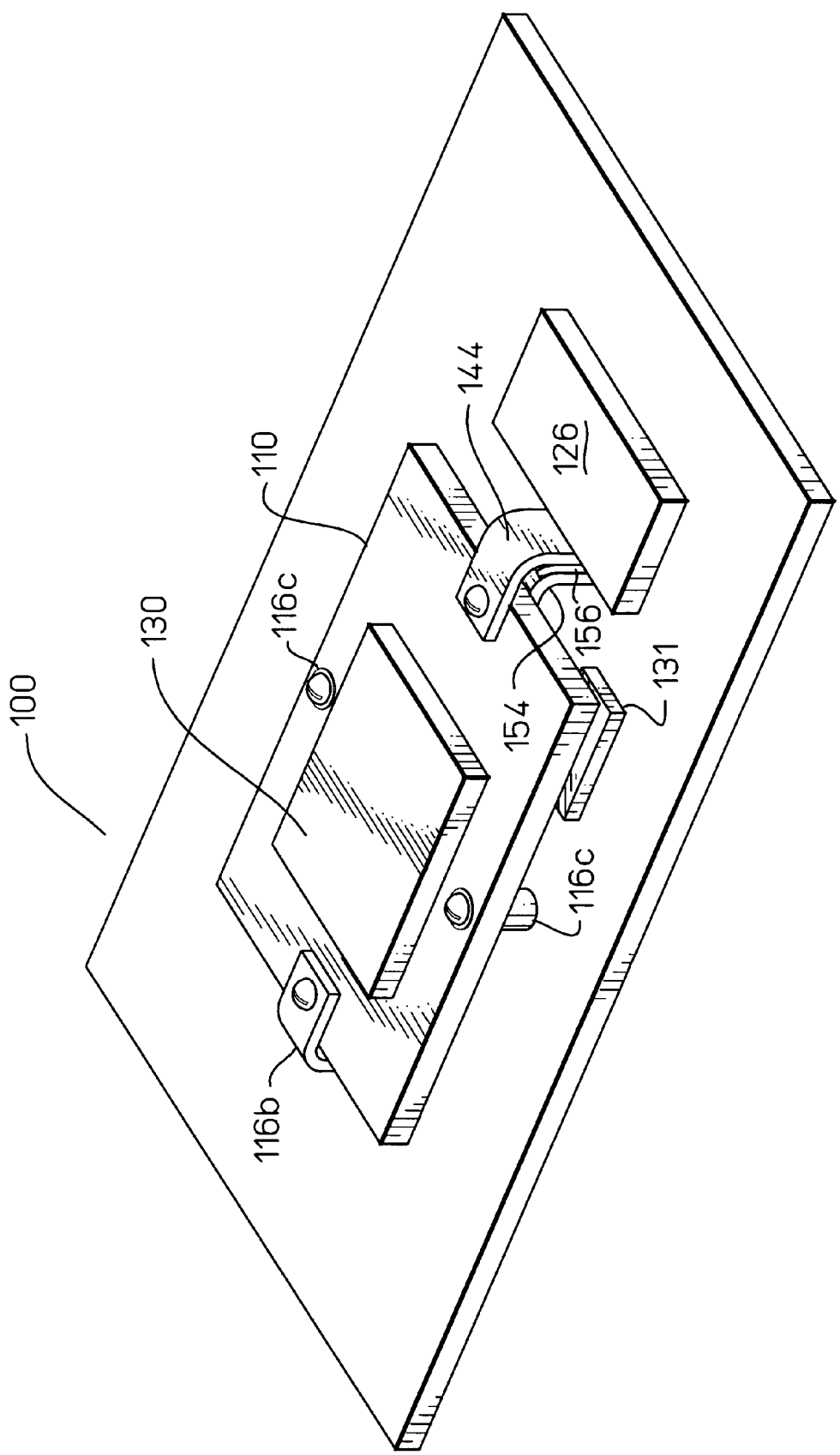
FIG. 4 shows a mounting platform according to an alternative embodiment of the present invention.

FIG. 4 shows a mounting platform according to an alternative embodiment of the present invention. In the embodiment shown in FIG. 3, the platform top is comprised of a platform PCB and does not include a platform conductive frame as is shown in the embodiment in FIGS. 1–3. FIG. 5 shows a side cross-sectional view of the output leg of the mounting platform shown in FIG. 4. Comparing FIG. 3 to FIG. 5, the second output conductor 150 shown in FIG. 5 is a separate structure and is not formed as a unitary part of the ground plane of the platform PCB.

It is understood that the above description is intended to be illustrative and not restrictive. For example, the structure of the input power leg and the output power leg are similar and typically functional and structural statements made for the input power leg are analagous to the output power leg. The scope of the invention should therefore be determined not with reference to the above description, but instead should be determined with reference to the appended claims, along with the full scope of equivalents to which such claims are entitled.

What is claimed is:

1. A mounting platform configuration, comprising:
   a platform top including a platform printed circuit board, the platform printed circuit board including a first electrical contact formed on a first surface of the platform printed circuit board and a second electrical contact formed on a second surface of the platform printed circuit board;
   a first device mounted on the first surface of the platform printed circuit board, wherein the first device is electrically coupled to the platform printed circuit board;
   a base printed circuit board, the base printed circuit board including a first electrical contact formed on a second surface of the base printed circuit board and a second electrical contact formed on a first surface of the base printed circuit board;
   a second device mounted on the first surface of the base printed circuit board; and
   a plurality of conductive legs, including at least one output leg for mechanically supporting the platform printed circuit board in a position above the base printed circuit board such that the second surface of the platform printed circuit board is positioned above the first surface of the base printed circuit board by a distance that is at least a thickness of the second device, the output leg including a first output conductor and a second output conductor, wherein the first output conductor is generally parallel to the second output conductor, wherein the first output conductor is electrically isolated from the second output conductor, wherein the first output conductor is electrically coupled to the first electrical contact of the platform printed circuit board and the first electrical contact of the base printed circuit board, wherein the second output conductor is electrically coupled to the second electrical contact of the platform printed circuit board and the second electrical contact of the base printed circuit board, wherein the output leg and the platform top are electrically and mechanically coupled by a fastening means.

2. The mounting platform configuration recited in claim 1 wherein the platform printed circuit board further includes a third electrical contact and a fourth electrical contact, wherein the base printed circuit board further includes a third electrical contact and a fourth electrical contact, wherein the plurality of conductive legs further includes at least one input leg, the input leg including a first input conductor and a second input conductor, wherein the first input conductor is generally parallel to the second input conductor, wherein the first input conductor is electrically isolated from the second input conductor, wherein the first input conductor is electrically coupled to the third electrical contact of the platform printed circuit board and the third electrical contact of the base printed circuit board, wherein the second input conductor is electrically coupled to the fourth electrical contact of the platform printed circuit board and the fourth electrical contact of the base printed circuit board.

3. The mounting platform configuration recited in claim 2 wherein the first device is a voltage regulator and the second device is a microprocessor.

4. The mounting platform configuration recited in claim 3 wherein the mounting platform is placed adjacent to, but not directly over the microprocessor.

5. The mounting platform recited in claim 3 wherein the output leg is a leg carrying power from the voltage regulator to the microprocessor, wherein the output leg is placed in close proximity to the microprocessor.

6. The mounting platform configuration recited in claim 2, further including an input leg insulator positioned between the first input conductor and the second input conductor.

7. The mounting platform configuration recited in claim 2 wherein the output conductor and the second output conductor form a low impedance transmission line at high frequencies.

8. The mounting platform configuration recited in claim 1, further including an output leg insulator positioned between the first output conductor and the second output conductor.

9. The mounting platform configuration recited in claim 8 wherein the output leg insulator has a high dielectric constant.

10. The mounting platform configuration recited in claim 1 wherein the platform printed circuit board includes a ground plane electrically coupled to the second electrical contact of the platform printed circuit board.

11. the mounting platform configuration recited in claim 1 further including a platform conductive frame wherein the second output conductor of the output leg extends from the platform conductive frame.

12. The mounting platform configuration recited in claim 1, wherein at least one support leg extends from the platform conductive frame to provide additional mechanical support.

13. The mounting platform configuration recited in claim 11, wherein the platform conductive frame is electrically coupled to a ground plane.

14. The mounting platform configuration recited in claim 11, wherein the fastening means is a screw.

15. A mounting platform configuration, comprising:
   a platform top including a platform conductive frame and a platform printed circuit board, the platform printed circuit board including a first electrical contact formed on a first surface of the platform printed circuit board and a second electrical contact formed on a second surface of the platform printed circuit board;
   a first device mounted on the first surface of the platform printed circuit board, wherein the first device is electrically coupled to the platform printed circuit board;

a base printed circuit board, the base printed circuit board including a first electrical contact formed on a second surface of the base printed circuit board and a second electrical contact formed on a first surface of the base printed circuit board;

a second device mounted on the first surface of the base printed circuit board; and a plurality of conductive legs, including at least one input leg and at least one output leg for mechanically supporting the platform printed circuit board in a position above the base printed circuit board such that the second surface of the platform printed circuit board is positioned above the first surface of the base printed circuit board by a distance that is at least a thickness of the second device, the output leg including a first output conductor and a second output conductor, wherein the first output conductor is generally parallel to the second output conductor, wherein the first output conductor is electrically isolated from the second output conductor, wherein the first output conductor is electrically coupled to the first electrical contact of the platform printed circuit board and the first electrical contact of the base printed circuit board, wherein the second output conductor is electrically coupled to the second electrical contact of the platform printed circuit board and the second electrical contact of the base printed circuit board; wherein a first end of the input leg is electrically and mechanically coupled to the base printed circuit board by soldering.

* * * * *